(12) United States Patent
Mazure et al.

(10) Patent No.: US 8,625,374 B2
(45) Date of Patent: Jan. 7, 2014

(54) NANO-SENSE AMPLIFIER

(71) Applicant: Soitec, Bernin (FR)

(72) Inventors: Carlos Mazure, Bernin (FR); Richard Ferrant, Esquibien (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/718,571

(22) Filed: Dec. 18, 2012

(65) Prior Publication Data

US 2013/0100749 A1    Apr. 25, 2013

Related U.S. Application Data

(63) Continuation of application No. 12/789,100, filed on May 27, 2010, now Pat. No. 8,358,552.

(30) Foreign Application Priority Data

Mar. 11, 2010  (FR) ...................... 10 51748

(51) Int. Cl.
    *G11C 7/00*     (2006.01)
    *G11C 11/4091*  (2006.01)

(52) U.S. Cl.
    CPC .................. *G11C 11/4091* (2013.01)
    USPC ........... 365/205; 365/148; 365/177; 365/196; 365/207; 365/189.04

(58) Field of Classification Search
    CPC ................ H01L 21/82345; H01L 21/823456; H01L 21/8239

USPC .................. 365/148, 177, 185.17, 203, 205, 365/230.03, 230.06, 63

See application file for complete search history.

(56) References Cited

U.S. PATENT DOCUMENTS

| 4,169,233 A | 9/1979 | Haraszti ........................ 307/355 |
| 5,028,810 A | 7/1991 | Castro et al. ................... 307/201 |

(Continued)

FOREIGN PATENT DOCUMENTS

| CN | 1716448 A | 1/2006 |
| EP | 1 081 748 A2 | 3/2001 |

(Continued)

OTHER PUBLICATIONS

Barth et al., "A 500MHz Random Cycle 1.5ns-Latency, SOI Embedded DRAM Macro Featuring a 3T Micro Sense Amplifier," IEEE International Solid-State Circuits Conference, Digest of Technical Papers, pp. 486-487, 617 (Feb. 2007).

(Continued)

*Primary Examiner* — Thong Q Le
(74) *Attorney, Agent, or Firm* — Winston & Strawn LLP

(57) ABSTRACT

A sense amplifier for a series of cells of a memory, including a writing stage comprising a CMOS inverter, the input of which is directly or indirectly connected to an input terminal of the sense amplifier, and the output of which is connected to an output terminal of the sense amplifier intended to be connected to a local bitline addressing the cells of the series, and a reading stage that includes a sense transistor, the gate of which is connected to the output of the inverter and the drain of which is connected to the input of the inverter.

20 Claims, 12 Drawing Sheets

(56) References Cited

U.S. PATENT DOCUMENTS

| | | | | |
|---|---|---|---|---|
| 5,306,530 | A | 4/1994 | Strongin et al. | 427/533 |
| 5,325,054 | A | 6/1994 | Houston | 324/158 |
| 5,455,791 | A | 10/1995 | Zaleski et al. | 365/185.26 |
| 5,557,231 | A | 9/1996 | Yamaguchi et al. | 327/534 |
| 5,608,223 | A | 3/1997 | Hirokawa et al. | 250/447.11 |
| 5,610,540 | A | 3/1997 | Althoff et al. | 327/51 |
| 5,646,900 | A | 7/1997 | Tsukude et al. | 365/205 |
| 5,753,923 | A | 5/1998 | Mera et al. | 250/443.1 |
| 5,844,845 | A | 12/1998 | Tahara | 365/189.05 |
| 5,869,872 | A | 2/1999 | Asai et al. | 257/360 |
| 5,889,293 | A | 3/1999 | Rutten et al. | 257/74 |
| 6,037,808 | A | 3/2000 | Houston et al. | 327/55 |
| 6,043,536 | A | 3/2000 | Numata et al. | 257/347 |
| 6,063,686 | A | 5/2000 | Masuda et al. | 438/406 |
| 6,072,217 | A | 6/2000 | Burr | 257/351 |
| 6,108,264 | A | 8/2000 | Takahashi et al. | 365/230.03 |
| 6,141,269 | A | 10/2000 | Shiomi et al. | 365/200 |
| 6,300,218 | B1 | 10/2001 | Cohen et al. | 438/423 |
| 6,372,600 | B1 | 4/2002 | Desko et al. | 438/406 |
| 6,476,462 | B2 | 11/2002 | Shimizu et al. | 257/627 |
| 6,498,057 | B1 | 12/2002 | Christensen et al. | 438/149 |
| 6,611,023 | B1 | 8/2003 | En et al. | 257/350 |
| 6,825,524 | B1 | 11/2004 | Ikehashi et al. | 257/314 |
| 7,109,532 | B1 | 9/2006 | Lee et al. | 257/133 |
| 7,112,997 | B1 | 9/2006 | Liang et al. | 326/81 |
| 7,447,104 | B2 | 11/2008 | Leung | 365/230.06 |
| 7,449,922 | B1 | 11/2008 | Ricavy | 327/57 |
| 2001/0030893 | A1 | 10/2001 | Terzioglu et al. | 365/200 |
| 2001/0038299 | A1 | 11/2001 | Afghahi et al. | 326/86 |
| 2001/0047506 | A1 | 11/2001 | Houston | 716/4 |
| 2002/0105277 | A1 | 8/2002 | Tomita et al. | 315/111.81 |
| 2002/0114191 | A1 | 8/2002 | Iwata et al. | 365/185.23 |
| 2002/0185684 | A1 | 12/2002 | Campbell et al. | 257/347 |
| 2003/0001658 | A1 | 1/2003 | Matsumoto | 327/534 |
| 2004/0108532 | A1 | 6/2004 | Forbes | 257/296 |
| 2004/0146701 | A1 | 7/2004 | Taguchi | 428/220 |
| 2004/0197970 | A1 | 10/2004 | Komatsu | 438/163 |
| 2005/0077566 | A1 | 4/2005 | Zheng et al. | 257/315 |
| 2005/0110078 | A1 | 5/2005 | Shino | 257/331 |
| 2005/0255666 | A1 | 11/2005 | Yang | 438/401 |
| 2005/0276094 | A1 | 12/2005 | Yamaoka et al. | 365/154 |
| 2006/0013028 | A1 | 1/2006 | Sarin et al. | 365/49 |
| 2006/0013042 | A1 | 1/2006 | Forbes et al. | 365/185.08 |
| 2006/0035450 | A1 | 2/2006 | Frank et al. | 438/585 |
| 2006/0209612 | A1 | 9/2006 | Kajigaya | 365/222 |
| 2006/0220085 | A1 | 10/2006 | Huo et al. | 257/296 |
| 2006/0226463 | A1 | 10/2006 | Forbes | 257/301 |
| 2006/0267064 | A1 | 11/2006 | Rosner et al. | 257/304 |
| 2006/0291321 | A1 | 12/2006 | Leung | 365/230.06 |
| 2007/0029596 | A1 | 2/2007 | Hazama | 257/296 |
| 2007/0029620 | A1 | 2/2007 | Nowak | 257/369 |
| 2007/0063284 | A1 | 3/2007 | Kawahara et al. | 257/351 |
| 2007/0075366 | A1 | 4/2007 | Hamamoto | 257/347 |
| 2007/0076467 | A1 | 4/2007 | Yamaoka et al. | 365/154 |
| 2007/0109906 | A1 | 5/2007 | Leung | 365/230.06 |
| 2007/0139072 | A1 | 6/2007 | Yamaoka et al. | 326/33 |
| 2007/0152736 | A1 | 7/2007 | Itoh et al. | 327/534 |
| 2007/0158583 | A1 | 7/2007 | Cho | 250/440.11 |
| 2007/0171748 | A1 | 7/2007 | Mukhopadhyay et al. | 365/208 |
| 2007/0241388 | A1 | 10/2007 | Yamamoto et al. | 257/314 |
| 2007/0298549 | A1 | 12/2007 | Jurczak et al. | 438/149 |
| 2008/0042187 | A1 | 2/2008 | Hwang | 257/316 |
| 2008/0111199 | A1 | 5/2008 | Kim et al. | 257/401 |
| 2008/0116939 | A1 | 5/2008 | Takizawa | 326/119 |
| 2008/0144365 | A1 | 6/2008 | Yamaoka et al. | 365/181 |
| 2008/0173916 | A1 | 7/2008 | Nishihara | 257/298 |
| 2008/0203403 | A1 | 8/2008 | Kawahara et al. | 257/80 |
| 2008/0251848 | A1 | 10/2008 | Borot et al. | 257/296 |
| 2008/0253159 | A1 | 10/2008 | Kajigaya | 365/51 |
| 2009/0003105 | A1 | 1/2009 | Itoh et al. | 365/203 |
| 2009/0010056 | A1 | 1/2009 | Kuo et al. | 365/184 |
| 2009/0086535 | A1 | 4/2009 | Ferrant et al. | 365/174 |
| 2009/0096011 | A1 | 4/2009 | Hong et al. | 257/321 |
| 2009/0096036 | A1 | 4/2009 | Ishigaki et al. | 257/392 |
| 2009/0101940 | A1 | 4/2009 | Barrows et al. | 257/204 |
| 2009/0111223 | A1 | 4/2009 | Wiatr et al. | 438/155 |
| 2009/0121269 | A1 | 5/2009 | Caillat et al. | 257/301 |
| 2009/0194824 | A1* | 8/2009 | Wirbeleit | 257/393 |
| 2009/0310431 | A1 | 12/2009 | Saito | 365/207 |
| 2010/0032761 | A1 | 2/2010 | Ding et al. | 257/350 |
| 2010/0035390 | A1 | 2/2010 | Ding et al. | 438/152 |
| 2010/0054016 | A1 | 3/2010 | Kajigaya | 365/48 |
| 2010/0054057 | A1 | 3/2010 | Meterelliyoz et al. | 365/194 |
| 2010/0079169 | A1 | 4/2010 | Kim et al. | 326/120 |
| 2010/0117684 | A1 | 5/2010 | Kim et al. | 326/120 |

FOREIGN PATENT DOCUMENTS

| | | | |
|---|---|---|---|
| EP | 1 095 407 | B1 | 5/2001 |
| EP | 1 199 745 | A2 | 4/2002 |
| EP | 1 233 454 | A2 | 8/2002 |
| EP | 1 357 603 | A2 | 10/2003 |
| EP | 1 744 364 | A2 | 1/2007 |
| FR | 2 925 223 | A1 | 6/2009 |
| JP | 64-88993 | A | 4/1989 |
| JP | 4345064 | A | 12/1992 |
| JP | 5-167073 | A | 7/1993 |
| JP | 8-255846 | A | 10/1996 |
| JP | 8-287692 | A | 11/1996 |
| JP | 9-232446 | A | 9/1997 |
| JP | 10-125064 | A | 5/1998 |
| JP | 2000-196089 | A | 7/2000 |
| JP | 2004-303499 | A | 10/2004 |
| WO | WO 99/66559 | A1 | 12/1999 |
| WO | WO 2004/097835 | A2 | 11/2004 |
| WO | WO 2007/060145 | A1 | 5/2007 |
| WO | WO 2008/134688 | A1 | 11/2008 |
| WO | WO 2009/013422 | A2 | 1/2009 |
| WO | WO 2009/028065 | A2 | 3/2009 |
| WO | WO 2009/077538 | A2 | 6/2009 |
| WO | WO 2009/085865 | A1 | 7/2009 |
| WO | WO 2009/104060 | A1 | 8/2009 |
| WO | WO 2010/007478 | A1 | 1/2010 |

OTHER PUBLICATIONS

Barth et al., "A 45nm SOI Embedded DRAM Macro for POWER7™ 32MB On-Chip L3 Cache," IEEE International Solid-State Circuits Conference, Digest of Technical Papers, pp. 342-344 (Feb. 2010).

Beckett, "Performance Characteristics of a Nanoscale Double-gate Reconfigurable Array," Proc of SPIE, 7268:72680E-1-72680E-12 (Dec. 2008).

Cheng et al., "Extremely Thin SOI (ETSOI) CMOS with Record Low Variability for Low Power System-on-Chip Applications," IEEE International Electron Devices Meeting, pp. 3.2.1-3.2.4 (Dec. 2009).

Choi et al., "Improved current drivability with back-gate bias for elevated source and drain structured FD-SOI SiGe MOSFET," Microelectronic Engineering, 86(11):2165-2169 (Nov. 2009).

Hassoune et al., "Double-gate MOSFET based reconfigurable cells," Electronics Letters, 43(23), 3 pages (Nov. 2007).

Ioannou et al., "Opposite-Channel-Based Injection of Hot-Carriers in SOI MOSFET's: Physics and Applications," IEEE Transactions on Electron Devices, 45(5):1147-1154 (May 1998).

Itoh et al., "Impact of FD-SOI on Deep-Sub-100-nm CMOS LSIs—A View of Memory Designers," IEEE International SOI Conference, pp. 103-104 (Oct. 2006).

Klim et al., "A 1 MB Cache Subsystem Prototype with 1.8 ns Embedded DRAMs in 45 nm SOI CMOS," IEEE Journal of Solid-State Circuits, 44(4):1216-1226 (Apr. 2009).

Kuhn, "Variation in 45nm and Implications for 32nm and Beyond," 2009 2nd International CMOS Variability Conference, London, pp. 1-86.

Mizukami et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

Matsumiya et al., "A 15-ns 16-Mb CMOS SRAM with Interdigitated Bit-Line Architecture," IEEE Journal of Solid-State Circuits, 27(11):1497-1503 (Nov. 1992).

Mukhopadhyay et al., "A Novel High-Performance and Robust Sense Amplifier Using Independent Gate Control in Sub-50-nm Double-

(56) References Cited

OTHER PUBLICATIONS

Gate MOSFET," IEEE Transactions on Very Large Scale Integration (VLSI) Systems, 14(2):183-192 (Feb. 2006).

Mukhopadhyay et al., "Design of High Performance Sense Amplifier Using Independent Gate Control in sub-50nm Double-Gate MOSFET," Proceedings of the Sixth International Symposium on Quality Electronic Design, pp. 490-495 (Mar. 2005).

Nasalski et al., "An Innovative sub-32nm SRAM Voltage Sense Amplifier in Double-Gate CMOS Insensitive to Process Variations and Transistor Mismatch," 15th IEEE International Conference on Electronics, Circuits and Systems, pp. 554-557 (Aug.-Sep. 2008).

Nasalski et al., "SRAM Voltage and Current Sense Amplifiers in sub-32nm Double-Gate CMOS Insensitive to Process Variations and Transistor Mismatch," IEEE International Symposium on Circuits and Systems, pp. 3170-3173 (May 2009).

Ohtou et al., "Threshold-Voltage Control of AC Performance Degradation-Free FD SOI MOSFET with Extremely Thin BOX using Variable Body-Factor Scheme," IEEE Transactions on Electron Devices, 54(2):301-307 (Feb. 2007).

Roy et al., "Double-Gate SOI Devices for Low-Power and High-Performance Applications," Proceedings of the 19th International Conference on VLSI Design, pp. 445-452 (Jan. 2006).

Tsuchiya et al., "Silicon on Thin BOX: A New Paradigm of the CMOSFET for Low-Power and High-Performance Application Featuring Wide-Range Back-Bias Control," IEEE International Electron Devices Meeting, pp. 631-634 (Dec. 2004).

Tsuchiya et al., "Controllable Inverter Delay and Suppressing $V_{th}$ Fluctuation Technology in Silicon on Thin BOX Featuring Dual Back-Gate Bias Architecture," IEEE International Electron Devices Meeting, pp. 475-478 (Dec. 2007).

Ulicki et al., "'De-myth-tifying' the SOI floating body effect," SOI Industry Consortium, pp. 2-7 (Sep. 2009).

Van Noije et al., "Advanced CMOS Gate Array Architecture Combining 'Gate Isolation' and Programmable Routing Channels," IEEE Journal of Solid State Circuits, 20(2):469-480 (Apr. 1985).

Yamaoka et al., "SRAM Circuit with Expanded Operating Margin and Reduced Stand-By Leakage Current Using Thin-BOX FD-SOI Transistors," IEEE Journal of Solid-State Circuits, 41(11):2366-2372 (Nov. 2006).

Yamaoka et al., "Dynamic-Vt, Dual-Power-Supply SRAM Cell using D2G-SOI for Low-Power SoC Application," IEEE International SOI Conference, pp. 109-111 (Oct. 2004).

U.S. Appl. No. 12/793,553, filed Jun. 3, 2010.
U.S. Appl. No. 12/793,515, filed Jun. 3, 2010.
U.S. Appl. No. 12/880,806, filed Sep. 13, 2010.
U.S. Appl. No. 12/886,421, filed Sep. 20, 2010.
U.S. Appl. No. 12/898,230, filed Oct. 5, 2010.
U.S. Appl. No. 12/961,293, filed Dec. 6, 2010.
U.S. Appl. No. 12/984,466, filed Jan. 4, 2011.
U.S. Appl. No. 12/942,754, filed Nov. 9, 2010.
U.S. Appl. No. 12/946,135, filed Nov. 15, 2010.
U.S. Appl. No. 12/974,822, filed Dec. 21, 2010.
U.S. Appl. No. 12/974,916, filed Dec. 21, 2010.
U.S. Appl. No. 13/007,483, filed Jan. 14, 2011.
U.S. Appl. No. 13/013,580, filed Jan. 25, 2011.
U.S. Appl. No. 13/039,167, filed Mar. 2, 2011.

European Search Report dated Feb. 16, 2010, Appl. No. EP 09290838.
European Search Report dated Sep. 15, 2010, Appl. No. EP 10290217.
European Search Report dated Jan. 6, 2011, Appl. No. EP 10290181.
European Search Report dated Aug. 19, 2011, Appl. No. EP 10175834.

\* cited by examiner

State of the art

NANO-SENSE AMPLIFIER

FIELD OF THE INVENTION

The invention generally relates to electronic memories, and more particularly to a sense amplifier of a series of memory cells.

BACKGROUND OF THE INVENTION

A conventional sense amplifier generally addresses about 256 to 1,024 memory cells via a line, a so-called bitline. The conventional sense amplifier is more specifically a differential amplifier operating with a bitline and a complementary bitline which is used as a reference line.

A conventional technique for increasing the performances of dynamic DRAM memory consists in reducing the number of cells addressed by a sense amplifier (reference is also made to a reduction in the length of the bitline). However, a larger number of sense amplifiers has to be provided in order to address the whole of the cells making up the memory, which is expressed by a loss of global efficiency insofar that management of the memory consumes useful surface area to the detriment of the actual memory.

In order to react to this loss of efficiency, the article "A 500 MHz Random Cycle, 1.5 ns Latency, SOI Embedded DRAM Macro Featuring a Three-Transistor Micro Sense Amplifier", J Barth et al., ISSCC (2007), Pages: 486-487 shows an architectural hierarchy based on sense amplifiers, so-called micro-sense amplifiers, addressing via a local bitline, few cells (32 typically) but consisting of very few (typically three) transistors.

This article proposes an architecture in which the different memory cells are made on a silicon-on-insulator substrate (SOI). The different micro-sense amplifiers are, as for them, formed either on a bulk substrate or a SOI substrate.

Each micro-sense amplifier has two input terminals connected to two main bitlines RBL (Read Bitline) and WBL (Write Bitline) which will control the read/write operations of the cells addressed in parallel via the local bitline LBL connected to the output terminal of the micro-sense amplifier.

Resorting to two main bitlines proves to be a problem in that the architecture proposed by this article cannot be transposed for producing standalone memories and thus remains limited to the production of embedded memories.

Further, each micro-sense amplifier can only address a reduced number of memory cells (16 to 32 typically) so that a relatively large number of micro-sense amplifiers (from 64 k to 128 k for a 2 Mbit memory) has to be resorted to. In spite of the relatively reduced size of the micro-amplifier (only 3 transistors), the drawback mentioned earlier of significant surface consumption for the sense amplification function, to the detriment of the memory function, therefore partly remains.

SUMMARY OF THE INVENTION

The present invention provides a technique and system which overcomes the drawbacks of the architectural hierarchy proposed in the aforementioned article.

For this purpose, the invention provides, according to a first aspect, a sense amplifier for a series of cells of a rewritable memory, including a writing stage comprising a CMOS inverter, the input of which is directly or indirectly connected to an input terminal of the sense amplifier, and the output of which is connected to an output terminal of the sense amplifier intended to be connected to a local bitline addressing the cells of said series; and a reading stage comprising a sense transistor, the gate of which is connected to the output of the inverter and the drain of which is connected to the input of the inverter.

According to a first embodiment, the input of the writing stage is directly connected to the input terminal of the inverter, said input terminal being intended to be connected to a main bitline which will address a plurality of sense amplifiers in parallel.

According to a second embodiment, the reading stage comprises an additional transistor, complementary to the sense transistor, the additional transistor and the sense transistor forming a CMOS inverter, the input of which is connected to the output of the writing stage and the output of which is connected to the input of the inverter of the writing stage.

In this second embodiment, the input of the writing stage may be indirectly connected to the input terminal of the inverter via a decoding stage comprising a transistor, the drain of which is connected to the input terminal of the sense amplifier and the source of which is connected to the input of the writing stage.

One or more transistors of the sense amplifier are multigate transistors. The biasing of one of the gates of the multigate transistors can be modified during operations for writing, reading and retaining data in the cells of said series.

The sense amplifier according to the first aspect of the invention is preferentially made on a semiconductor-on-insulator substrate comprising a thin layer of semiconducting material separated from a base substrate by an insulating layer, and each of the transistors has a back control gate formed in the base substrate below the channel and capable of being biased for modulating the threshold voltage of the transistor.

According to a second aspect, the invention relates to a method for controlling a sense amplifier according to the first aspect of the invention made on a SeOI substrate, in which the bias of the back control gates is modified during operations for writing, reading and retaining data in the cells of said series.

During a reading operation, the threshold voltage of the transistors of the writing stage may be increased and the threshold voltage of the transistor(s) of the reading stage may be decreased by controlling the bias of their back control gates.

During a writing operation, the threshold voltage of the transistors of the writing stage may be decreased and the threshold voltage of the transistor(s) of the reading stage may be increased by controlling the bias of their back control gates.

During a retention operation, the local bitline may be discharged via one of the transistors of the writing stage, for which the bias of the back control gate is controlled so as to lower its threshold voltage.

According to still another aspect, the invention relates to a matrix array of cells connected to local bitlines and to word lines, characterized in that it includes sense amplifiers according to the first aspect of the invention.

In the matrix array of cells, the sense amplifiers can be arranged in one or more sense amplifier banks and the matrix array can further comprise a column decoder placed next to each bank and configured to drive said bank directly. Further logic circuits can be placed next to the sense amplifier banks or the column decoder.

According to another aspect, the invention relates to a memory including a matrix array of cells.

The memory cells and the sense amplifiers of the memory are preferentially made on a semiconductor-on-insulator substrate.

According to still another aspect, the invention relates to a main sense amplifier intended to be connected via a main bitline to a plurality of sense amplifiers according to the first embodiment of the first aspect of the invention, characterized in that it comprises a stage for amplifying the signal delivered by a cell during a reading operation, and a switchable high impedance inverter stage for sending back the amplified signal onto the main bitline following the reading operation.

According to a further aspect, the invention relates to sense amplifier including a writing stage comprising a CMOS inverter, the input of which is directly or indirectly connected to an input terminal of the sense amplifier, and the output of which is connected to an output terminal of the sense amplifier intended to be connected to a local line; and a reading stage comprising a sense transistor, the gate of which is connected to the output of the inverter and the drain of which is connected to the input of the inverter. Advantageously, one or more transistors of the writing stage and of the reading stage are independent double gate transistors.

Yet according to another aspect, the invention relates to a matrix array of cells comprising sense amplifiers and column decoders, wherein the sense amplifiers are arranged in a non-staggered fashion in one or more sense amplifier banks and wherein a column decoder is placed next to each bank and configured to drive said bank directly.

BRIEF DESCRIPTION OF THE DRAWINGS

Other aspects, features and advantages of the present invention will become better apparent upon reading the following detailed description of preferred embodiments thereof, given as a non-limiting example, and made with reference to the appended drawings wherein:

FIG. 8b illustrates a detailed organization of the busses for decoding each of the nano-sense amplifiers of the banks in the architecture of FIG. 8a;

FIG. 9b illustrates a detailed organization of the busses for decoding each of the nano-sense amplifiers of the banks in the architecture of FIG. 9a.

DETAILED DESCRIPTION OF THE INVENTION

The invention according to a first aspect relates to a sense amplifier (called a nano-sense amplifier) of a series of cells of a memory.

Figure 1:
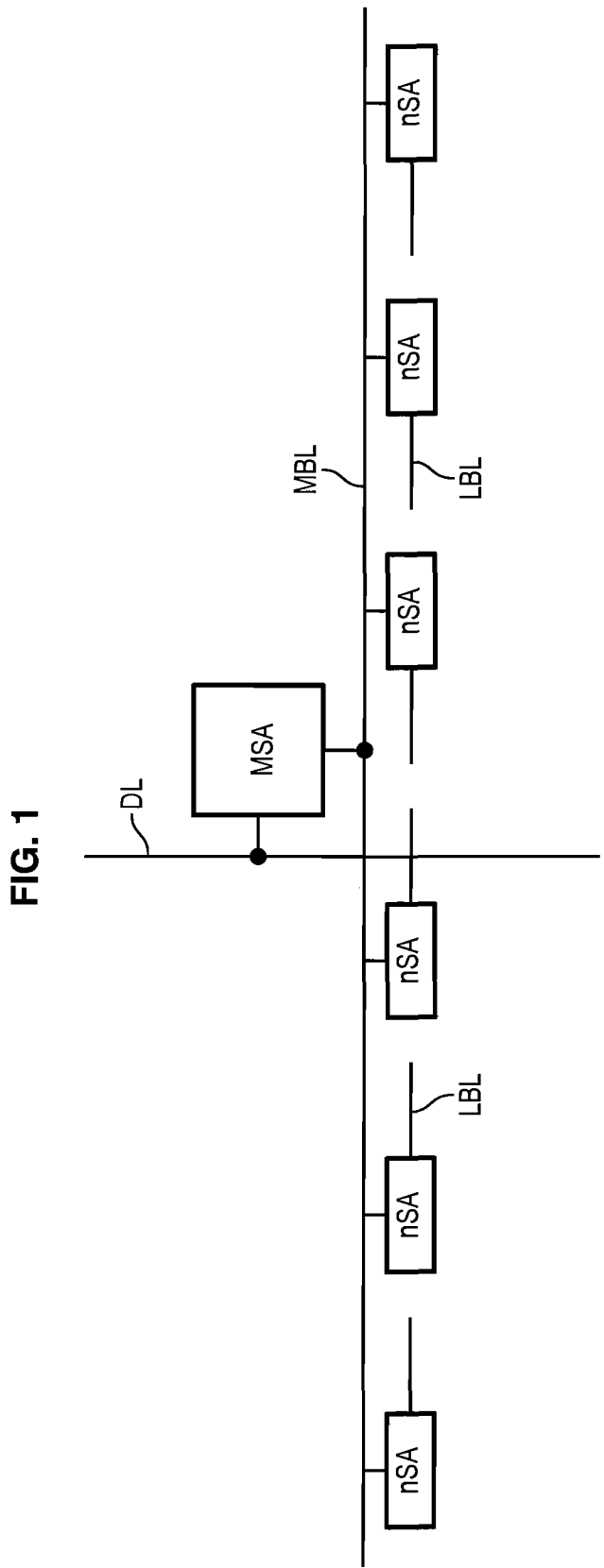
FIG. 1 illustrates the architectural hierarchy applied in a first embodiment of the invention.

An architectural hierarchy applied in a first embodiment of the invention is illustrated in FIG. 1 and according to which a nano-sense amplifier nSA covers a series of memory cells via a local bitline LBL, typically between 128 and 512 memory cells.

The nano-sense amplifier nSA transfers data towards/from a main sense amplifier MSA via a main bitline MBL. The main bitline MBL covers a series of nano-sense amplifiers nSA, typically between 16 and 32 nano-sense amplifiers nSA.

The main sense amplifier MSA is moreover connected to a line, a so-called dataline DL, on which read/written data circulate in the memory cells.

It will be understood from the description which follows of the first embodiment of the invention that a nano-sense amplifier nSA provides the reading and writing functions, while the refreshing function is achieved by the main sense amplifier MSA which forms the interface between the nano-sense amplifier nSA and the peripheral circuits.

It will be noted from now on that the nano-sense amplifier nSA has a single connection (the main bitline MBL) with the main sense amplifier MSA, with which it is possible to meet the constraints in terms of metallization width both in the field of embedded memories and in that of standalone memories.

Figure 2:
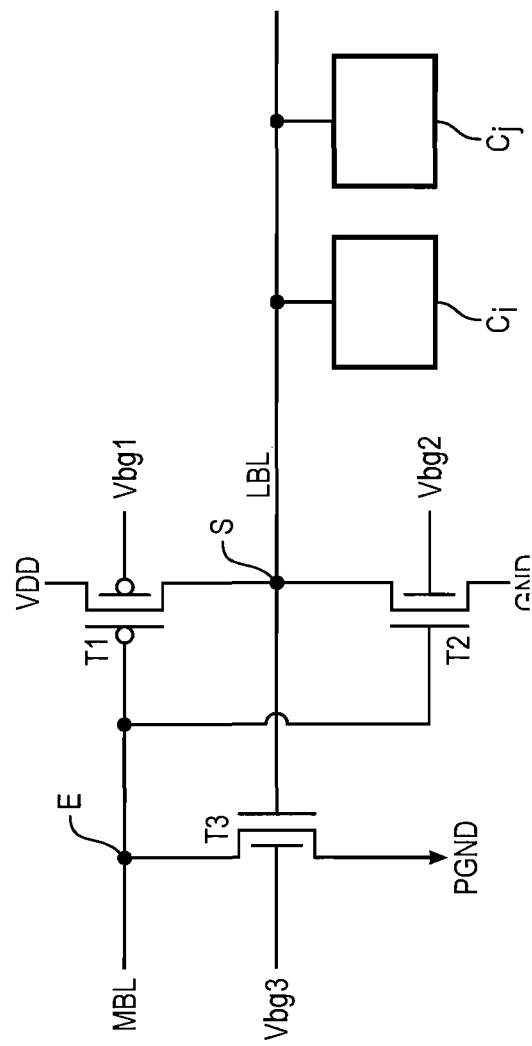
FIG. 2 illustrates a nano-sense amplifier according to the first embodiment of the invention.

As illustrated in FIG. 2, a nano-sense amplifier nSA according to the first embodiment of the invention only includes three transistors T1, T2, T3.

The nano-sense amplifier nSA more specifically comprises an input terminal E connected to the main bitline MBL and an output terminal S connected to the local bitline LBL via the input terminal E.

The nano-sense amplifier nSA comprises a writing stage comprising a CMOS inverter, the input of which is directly connected to the input terminal E and the output of which is connected to the output terminal S.

The CMOS inverter comprises, between two terminals for applying power supply potentials, VDD and GND respectively, a transistor with a first type of channel in series with a transistor with a second type of channel.

In the illustrated embodiment, the inverter comprises a P channel transistor T1, the source of which is connected to the potential VDD (high state) and a N channel transistor T2, the source of which is connected to the potential GND (low state). The gates of the transistors of the inverter are connected together and connected to the main bitline MBL. The middle point of the serial combination of the transistors T1 and T2 (the output of the inverter) is as for it connected to the local bitline LBL.

The nano-sense amplifier nSA further comprises a reading stage formed by a transistor T3, here an N channel transistor, the gate of which is connected to the output of the inverter and to the local bitline LBL, the drain of which is connected to the input of the inverter and to the main bitline MBL, and the source of which is connected to a terminal for applying a power supply potential PGND.

Within the scope of a preferred embodiment of the invention, the nano-sense amplifier nSA is made on a semiconductor-on-insulator substrate comprising a thin layer of semiconducting material separated from a base substrate by an insulating layer. Each of the transistors has a back control gate formed in the base substrate below the channel and capable of being biased in order to modulate the threshold voltage of the transistor. The bias respectively applied to the back control gate of transistors T1, T2 and T3 is illustrated on the figure by references Vbg1, Vbg2 and Vbg3.

It will be noted that the modulation of the threshold voltage is particularly advantageous in that it allows the operation of a transistor to be forced so as to ensure, depending on the circumstances, that it is actually blocked or conducting. With this, the operation of the nano-sense amplifier nSA may be made more secure, and therefore the operation margin thereof may be increased (which allows association of a larger number of memory cells with the nano-sense amplifier nSA).

Figure 3A:
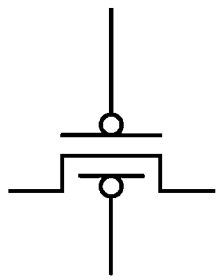
FIGS. 3a and 3b illustrate exemplary transistors having back control gates.

In FIG. 3a, a P channel transistor is illustrated, having a back control gate $BG_P$ arranged in the base substrate under the BOX insulating layer so as to be positioned facing the front control gate G. The back control gate $BG_P$ is formed here by a P type doped region isolated from the base substrate by an N conductivity well $C_N$.

Figure 3B:
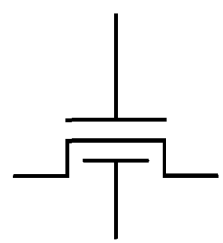
Figure 3B:
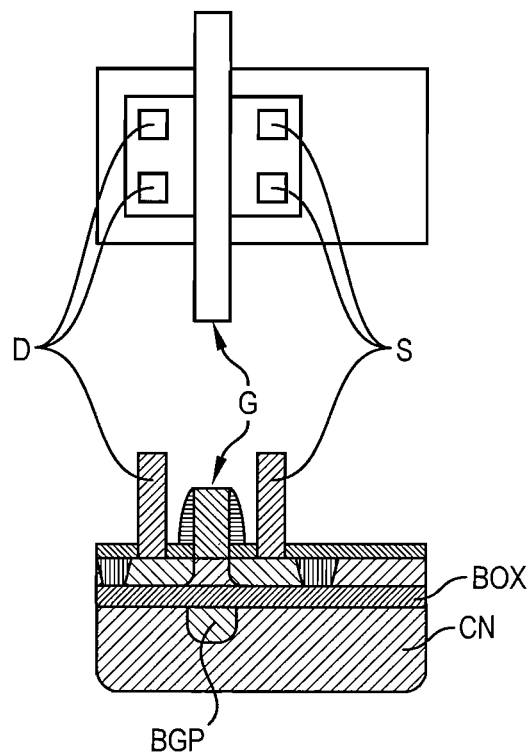
Figure 3B:
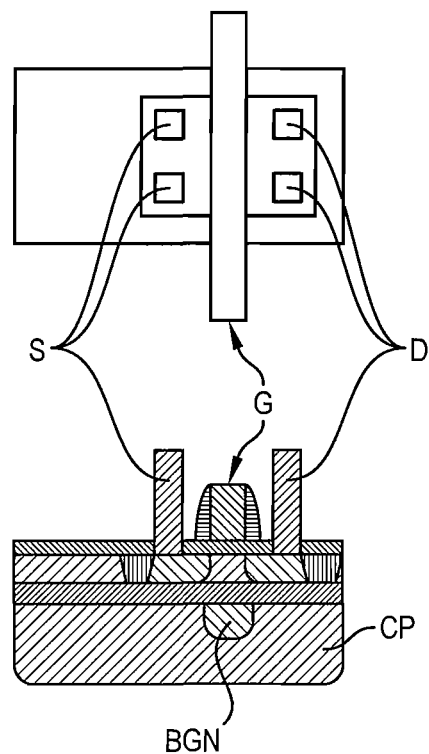

In FIG. 3b, an N channel transistor is illustrated, having a back control gate $BG_N$ arranged in the base substrate under the insulating layer so as to be positioned facing the front control gate G. The back control gate $BG_N$ is formed here by an N type doped region insulated from the base substrate by a P conductivity well $C_P$.

In FIGS. 3a and 3b, the transistors are fully depleted SeOI transistors defined by a channel/body region that is thin enough to allow the field induced by the top control gate (under usual voltage conditions) to reach the buried oxide layer BOX.

A transistor for which the channel has a conductivity of type N and a back control gate of P conductivity, has a very high threshold voltage. This threshold voltage may then be reduced by applying a positive voltage on the back control gate. A transistor for which the channel has a conductivity of type N and a back control gate of conductivity N as for it has a nominal threshold voltage which may be reduced by applying a positive voltage on the back control gate.

This variation of the threshold voltage of the transistor via the back control gate may be formulated according to $V_{th}=V_{t0}-\alpha.V_{BG}$, wherein $V_{th}$ represents the threshold voltage of the transistor, $V_{BG}$ the voltage applied to the back control gate, $V_{t0}$ the nominal threshold voltage (which may be shifted by the work function depending on whether a back control gate of type N or P is used), and $\alpha$ is a coefficient related to the geometry of the transistor.

The different writing, reading and retention operations which may be applied by the nano-sense amplifier of FIG. 2 are described hereafter.

Reading

During an operation for reading the datum stored in a memory cell Ci, Cj connected to the local bitline LBL, and selected by means of a line, a so-called wordline (not shown), the transistor T3 of the reading stage is the sensor, while the transistors T1 and T2 of the reading stage are blocked in order to avoid any corruption of the signal from the selected cell.

The inverter has a voltage of VDD/2 (potentially floating voltage) on its input E.

A high voltage is applied to the back control gate of the P channel transistor T1 (Vbg1 is for example in the high state VDD) so as to set its threshold voltage above VDD/2 and to thereby block the transistor T1. If this does not prove to be sufficient, it is also possible to reduce the power supply potential VDD of the transistor T2 during this reading operation, by typically using a voltage already existing in the circuit such as VDD/2.

Moreover, a low voltage is applied to the back control gate of the N channel transistor T2 (Vbg2 is for example in the low state GND) so as to set its threshold voltage above VDD/2 and to thereby block the transistor T1. If this does not prove to be sufficient, it is also possible to increase the power supply potential GND of the transistor T1 during this operation, for example by a few hundred millivolts, typically by using a voltage already existing in the circuit, such as VDD/2.

The selected cell to be read typically provides 200-300 mV if it contains a "1" and 0 mV if it contains a "0".

A high voltage is applied to the back control gate of the N channel sense transistor T3 (Vbg3 is for example in the high state VDD), in order to lower its threshold voltage below the level provided at its gate by the local bitline LBL. The power supply potential PGND of the transistor T3 is here in the low state, for example GND.

If a "1" is present on the local bitline LBL, the sense transistor T3 is conducting, and the main sense amplifier MSA may then either detect the current flowing in the main bitline MBL through the transistor T3, or sense a voltage level change on the main bitline MBL (which drops since T3 is conducting) if the node was initially floating.

If a "0" is present on the local bitline LBL, the sense transistor T3 is blocked and the main sense amplifier MSA may then either detect zero current on the main bitline MBL, or sense a non-modified voltage level on the main bitline MBL.

Writing

During an operation for writing a datum stored in a memory cell Ci, Cj connected to the local bitline LBL, and selected by means of word line, the transistor T3 of the reading stage is blocked in order to avoid any corruption of the signal from the main sense amplifier MSA via the main bitline MBL, while the transistors T1 and T2 of the reading stage conduct as efficiently as possible this signal from the main bitline MBL towards the local bitline LBL.

In the following, a distinction is made between writing a "0" (Write 0 operation), and writing a "1" (Write 1 operation).

Write 0

The inverter stage has, via the main bitline MBL, a "1" at its input.

A low state is applied to the back control gate 1 of the P channel transistor T1 (Vbg1 is for example at GND) in order to lower its threshold voltage as much as possible (preferably below VDD/2, for example around 100-200 mV in absolute value). The transistor T1 is blocked insofar that it receives a high state on its front control gate. The power supply potential of the transistor T1 is maintained at VDD, so that other nano-sense amplifiers in parallel (i.e. sharing the same power supply potential) may perform writing of a "1" at the same time.

A high state is applied to the back control gate of the N channel transistor T2 (Vbg2 is for example at VDD), in order to lower its threshold voltage (preferably below VDD/2, for example around 100-200 mV in absolute value). The transistor T2 receives a high state on its front control gate and is therefore conducting. Insofar that its threshold voltage was lowered, the conduction level of transistor T2 is increased (or further, the size of the transistor T2 may be reduced if an identical conduction level is maintained).

A low state is applied to the back control gate of the N channel transistor T3 of the reading stage (Vbg3 is for example in the low state GND), and this so that it has a high threshold voltage, preferably above VDD/2. As the local bitline LBL is in the low state because of the action of the transistor T2 of the writing inverter, transistor T3 is blocked and therefore does not corrupt the "1" delivered on the main bitline MBL.

The power supply potential PGND of the transistor T3 is here in the low state, for example GND. This power supply potential PGND may however be increased in order to attain a value close to VDD/2 (below the threshold voltage of T3) in order to ensure that the transistor T3 is actually transparent with respect to the main bitline MBL and does not generate conflicts therein, notably during transitions between the different operations.

Write 1

The inverter stage has, via the main bitline MBL, a "0" at its input, and the order of the operations of transistors T1 and T2 is inverted relatively to the Write 0 operation. Thus a high state is applied to the back control gate of the N channel transistor T2 (Vbg2 is for example at VDD) in order to lower its threshold voltage as much as possible (preferably below VDD/2, for example around 100-200 mV in absolute value). The transistor T2 is blocked insofar that it receives a high state on its front control gate and the power supply potential of transistor T2 is maintained at GND, so that other nano-sense amplifiers in parallel (i.e. sharing the same power supply potential) may perform writing of a "0" at the same time.

A low state is applied to the back control gate of the P channel transistor T1 (Vbg1 is for example at GND), so that it has a low threshold voltage (preferably below VDD/2, for example around 100-200 mV in absolute value). The transistor T1 receives a high state on its front control gate and is therefore conducting. Insofar that its threshold voltage was lowered, the conduction level of the transistor T1 is increased (or further by retaining an identical conduction level, the size of transistor T1 may be reduced).

A low state is applied to the back control gate of the N channel transistor T3 of the reading stage (Vbg3 is for example in the low state GND), and this in order to increase its threshold voltage, preferably above VDD/2. The power supply potential PGND of the transistor T3 is here in the low state, for example GND.

As the local bitline LBL is in the high state because of the action of the transistor T1 of the writing inverter, transistor T3 is conducting, but does not corrupt the "0" delivered on the main bitline MBL since its source and its drain are both at the same value (low state GND). The power supply potential PGND may however be increased in order to attain a value close to VDD/2 (below the threshold voltage of T3) in order to ensure that the transistor T3 is actually transparent relatively to the main bitline MBL, and does not generate conflicts therein, notably during transitions between the different operations.

Retention

It is sought to avoid any static current, and thereby block the three transistors by ideally minimizing leakages.

In a preferential embodiment, the retention operation is applied by preparing the reading or writing operation which will follow, and this by discharging the local bitline to the low state GND which is a prior condition for writing.

The inverter has a voltage of VDD/2 (potentially floating voltage) on its input.

A high voltage is applied to the back control gate of the P channel transistor T1 (Vbg1 is for example in the high state VDD) so as to set its threshold voltage above VDD/2 and to thereby block the transistor T1. If this does not prove to be sufficient, it is also possible to reduce the power supply potential VDD of the transistor T2 during this retention operation.

Moreover, a high voltage is applied to the back control gate of the N channel transistor T2 (Vbg2 is for example in the high state VDD) so as to lower its threshold voltage (to about 100-150 mV). The transistor T2 is conducting, which allows the local bitline LBL to be discharged and to be forced to the low state GND, thereby preparing it for the next access. As the circuit is in retention, no cell is selected and there is therefore no current.

Insofar that the local bitline LBL is in the low state GND, transistor T3 is blocked and therefore no current flows through it. A low voltage may be applied to the back control gate of the transistor T3 (Vbg3 is for example in the low state GND), which increases its threshold voltage and allows minimization of the leakages.

Figure 4A:
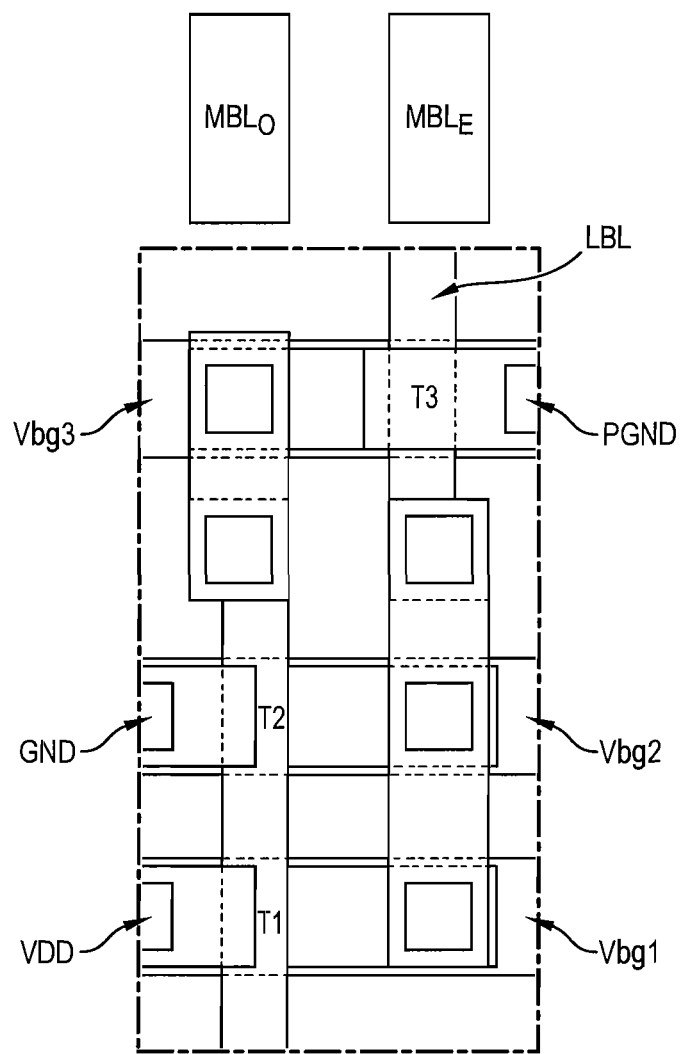
FIG. 4a illustrates a possible topology of a nano-sense amplifier according to FIG. 2.

In FIG. 4a, a possible topology of the nano-sense amplifier of FIG. 2 made on two columns is illustrated. Only three metals are necessary: Metal1 for the interconnections of the transistors, Metal2 for the distribution of the power supply potentials PGND, GND and VDD, Metal3 for the main bitline MBL.

The width of the nano-sense amplifier corresponds to two metal lines or two columns of cells in the case of a DRAM. It will be noted that the three back control gates are active and may consequently be subject to RC delays. It is then possible to choose to regenerate them periodically, ideally at the same repeating frequency as the word line drivers.

The memory cell, as for it, requires a Metal1 line for attaching it to the local bitline and a Metal2 line for attaching it to the word line. This leaves the Metal3 line free for letting through the main bitline MBL.

Figure 4B:
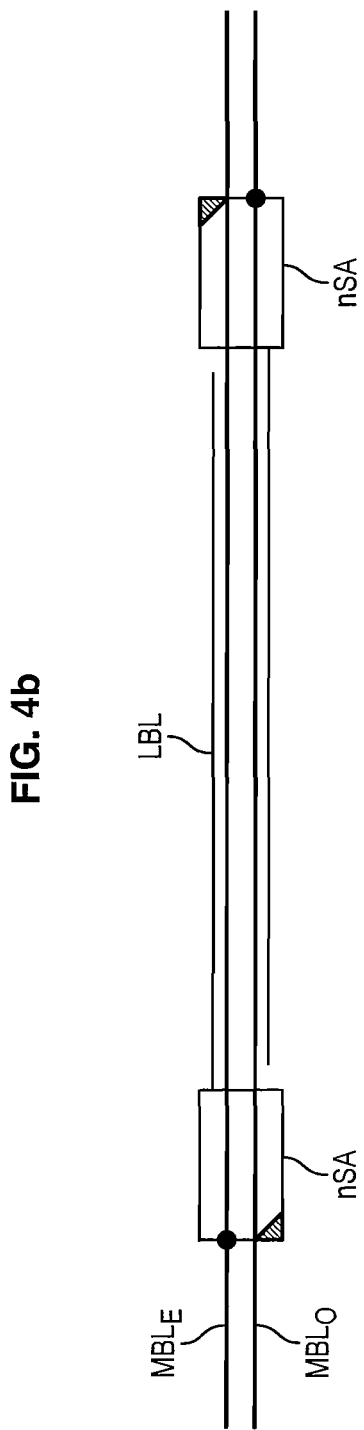
FIG. 4b illustrates a possible organization of nano-sense amplifiers according to FIG. 2 along columns of a memory matrix.

Insofar that each column of the memory matrix requires a nano-sense amplifier, a possible organization may consist of arranging the nano-sense amplifiers head-to-tail as this is illustrated in FIG. 4b, a first nano-sense amplifier having on its input terminal the signal $MBL_E$ and addressing via its local bitline a series of cells along a first (even) column, the other nano-sense amplifier having on its input terminal the signal $MBL_O$ and addressing via its local bitline a series of cells along a second (odd) column directly following adjacent to the first column in the memory matrix.

Preferential conditions for the operation of the nano-sense amplifier of FIG. 2 are threshold voltages of the transistors, close to VDD/2 and a variation of these threshold voltages by biasing the back control gates in a range approximately comprised between 100 mV and VDD/2+150 mV.

These conditions involve lithography levels beginning at 55-45 nm (VDD of the order of 1 V, threshold voltage of the order of 350 mV and which decreases with the scale effect; the node 45 nm having been attained in 2007-2008), and thicknesses of the order of 2-20 nm for the thin layer of the SeOI substrate and of the order of 5-50 nm for the buried insulating layer of the SeOI substrate.

It will be noted that the nano-sense amplifier is mainly developed for DRAM memories. However, it operates with any type of RAM memory (SRAM, PCRAM, CBRAM, ZRAM), as well as with flash memories (with, in this case, the requirement of maintaining relatively high voltages during the writing and deleting (erasing) operations; this may for example be achieved by using two transistors in series rather than a single one for the transistors T1-T3).

Figure 5:
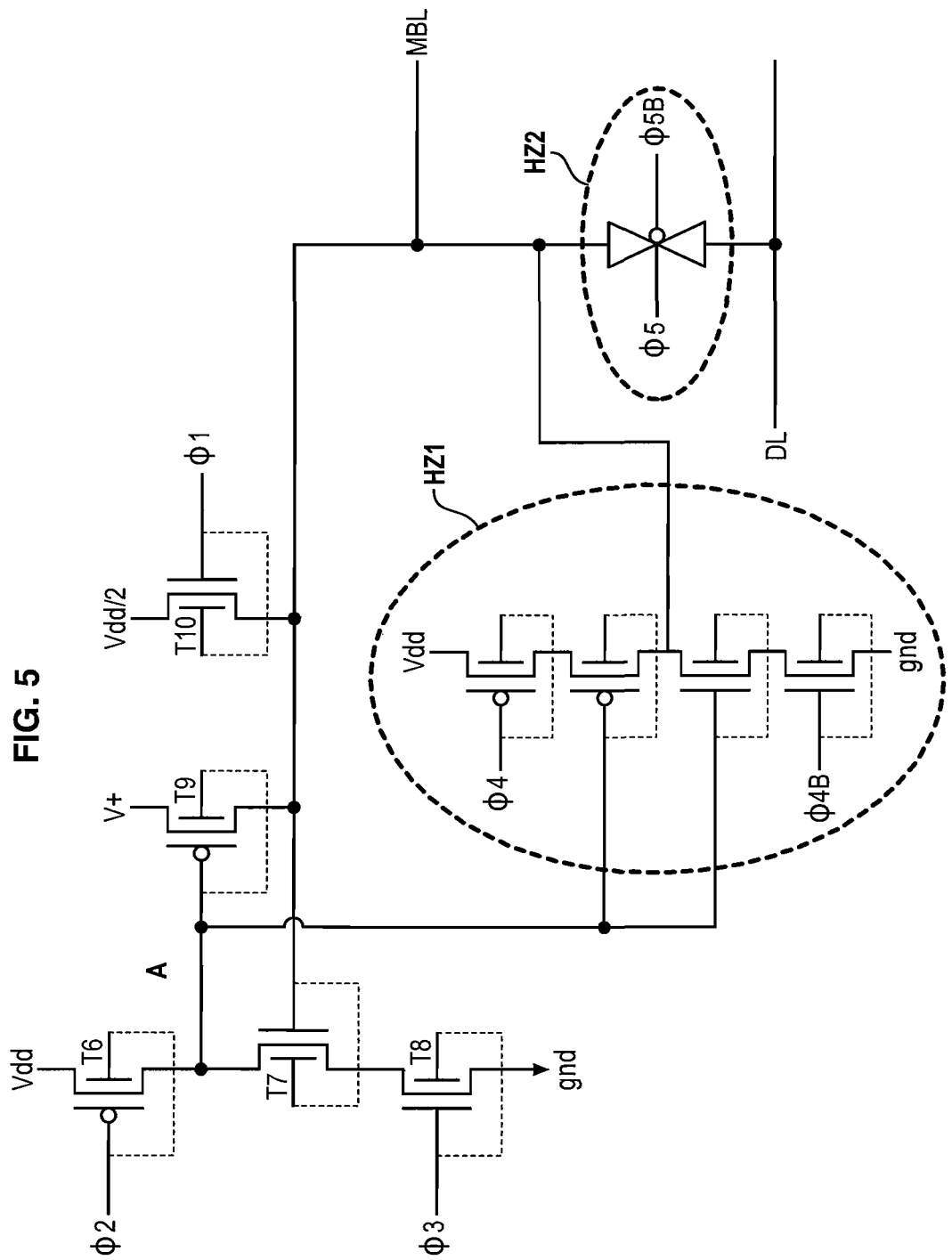
FIG. 5 illustrates a main sense amplifier intended for transferring data towards/from a plurality of nano-sense amplifiers according to FIG. 2.

As this was seen earlier, in the case of the DRAM, the nano-sense amplifier performs reading and writing operations but does not perform the refreshing/restoring operation; the latter being performed by the main sense amplifier MSA, a possible embodiment of which is described hereafter in connection with FIG. 5. A DRAM cell actually requires being periodically refreshed in order to compensate charge losses and being restored after each read access.

The main sense amplifier MSA is connected to nano-sense amplifiers via a main bitline MBL on the one hand, and to the peripheral circuits via a data line DL on the other hand. The amplifier MSA comprises, in series between the potentials VDD and GND, three transistors T6-T8. Transistor T6 is a P channel transistor, the front control gate of which is controlled by a signal Φ2. Transistor T7 is an N channel transistor, the front control gate of which is connected to the main bitline MBL. Transistor T8 is a P channel transistor, the front control gate of which is controlled by a signal Φ3.

The amplifier MSA further comprises an N channel transistor T10 between the main bitline MBL and a power supply potential at VDD/2 and the front control gate of which is controlled by a signal Φ1.

The amplifier MSA also comprises a P channel transistor T9 between the main bitline MBL and a power supply potential V+ and the front control gate of which is connected to the node A corresponding to the middle point of transistors T6 and T7.

As this will be explained in more detail subsequently, the whole of the transistors T6-T10 forms a stage for amplifying the signal delivered by a cell (on the local bitline LBL towards a nano-amplifier) during a reading operation.

The node A is connected to a high impedance inverter HZ1, the application of the inversion function of which is controlled by a control signal Φ4 (in FIG. 5, Φ4B designates the complementary of Φ4).

The output of the high impedance inverter HZ1 is looped back onto the main bitline MBL.

As this will be detailed subsequently, the inverter HZ1 thus forms a switchable high impedance inverter stage for sending back the amplified signal on the main bitline following a reading operation.

A high impedance stage HZ2, controlled by a signal Φ5 (Φ5B designating the complementary of Φ5), enables the data line DL to be connected to the main bitline MBL.

Initialization of the MSA amplifier is as follows.

Φ2 is set to "1", while Φ3 is set to "0". As the transistors T6 and T8 are blocked, the set T6, T7 and T8 is floating.

The power supply potential V+ of the transistor T9 is moreover set to VDD/2.

Both stages HZ1 and HZ2 are floating, while the transistor T10 will, as for it, pre-charges the main bitline MBL to VDD/2, via the application of a negative pulse by the control signal Φ1.

An operation for reading a "1" and for restoring this "1" implemented by the MSA amplifier is the following.

The read cell delivers a "1" on the local bitline LBL. The transistor T3 of the nano-sense amplifier nSA discharges the main bitline MBL to the low state GND. Transistor T7 is then blocked.

The power supply potential V+ of the transistor T9 is increased from VDD/2 to VDD.

The control signal Φ3 of the gate of the transistor T8 is set to the high state VDD, so as to make the transistor T8 conducting. As the transistor T7 is blocked, it will cut the path towards the node A.

The control signal Φ2 of the gate of the transistor T6 is set to the low state GND, so as to make the transistor T6 conducting. The potential of the node A then increases to VDD, which causes blocking of the transistor T9.

The control signal Φ4 will make the HZ1 stage conducting. The latter conducts the main bitline MBL to the low state GND (by inversion of the high state of the node A), and sends back this low state to the nano-amplifier nSA, which will then rewrite a "1" (cf. previous discussion of a Write 1 writing operation by the nano-amplifier nSA).

The control signal Φ5 will make the HZ2 stage conducting. The latter will then deliver the signal of the main bitline (stemming from the HZ1 stage) to the date line DL for processing by the input/output peripheral circuits (the data line DL is floating in order to accept the signal from the main bitline MBL).

An operation for reading a "0" and for restoring this "0" performed by the amplifier MSA is as follows.

The cell read delivers a "0" on the local bitline LBL. The transistor T3 of the nano-sense amplifier nSA remains blocked and the main bitline MBL remains at VDD/2. Transistor T7 is then conducting.

The potential V+ of the transistor T9 is increased from VDD/2 to VDD.

The control signal Φ3 of the gate of the transistor T8 is set to the high state VDD, so as to make transistor T8 conducting.

The control signal Φ2 of the gate of the transistor T6 is set to the low state GND, so as to make transistor T6 conducting.

The transistor T6 is a weak transistor as compared with the serial association of transistors T7 and T8, the potential of the node A drops to "0". This leads the transistor T9 to a conducting (also weak) state, this has the consequence of leading the local bitline to VDD (from V+). Next, the transistor T7 will lead the node A closer to the low state GND.

The control signal Φ4 will make the stage HZ1 conducting. The latter leads the main bitline MBL to the high state VDD (by inversion of the low state of the node A), and sends back this high state to the nano-amplifier nSA, which will then rewrite a "0" (cf. previous discussion of a Write 0 writing operation by the nano-amplifier nSA).

The control signal Φ5 will make the HZ2 stage conducting. The latter will then deliver the signal from the main bitline MBL (stemming from the HZ1 stage) to the data line DL for processing by the input/output peripheral circuits (the data line DL is floating in order to accept the signal from the main bitline MBL).

A writing operation performed by the MSA amplifier is the following. From the point of view of the MSA amplifier, this operation is similar to a reading operation. The only difference stems from the initial conduction of the main bitline MBL because of its powering from the data line via the HZ2 stage.

The following steps are the same, except with regard to the last point (transfer to the data line) which is out of context for a writing operation.

It will be noted that in FIG. 5, the different transistors T6-T10 were illustrated with back control gates, each being respectively connected to the corresponding front control gate. This illustration was only made for sake of clarity, and it will be understood that in practice the back control gates are biased in the most suitable way for increasing the performances of the MSA amplifier.

As examples, the back control gates of transistors T7 and T9 may be biased so that these transistors have relatively high threshold voltages and are thus weaker than the other transistors.

In the foregoing, an embodiment of the MSA amplifier is reported within the scope of an application to DRAM memories. It will be retained that because of problems of noise and of variability encountered with SRAM memories, the MSA amplifier described earlier may advantageously be used therein for reinforcing the quality of the signal and for increasing the security of such circuits.

An MSA amplifier of the same type may be used with RAM memories (PCRAM, CBRAM, FBC-DRAM, etc.). It may also be used with flash memories, while bringing attention to the requirement of supporting the relatively high voltages required by the memory cell.

Figure 6:
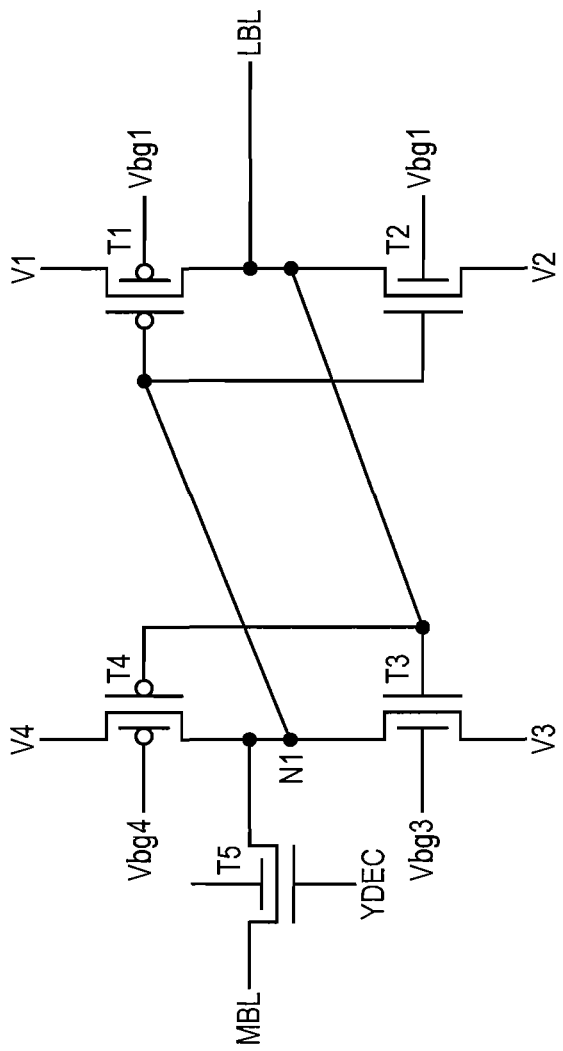
FIG. 6 illustrates a nano-sense amplifier according to a second embodiment of the invention.

A nano-sense amplifier μSA according to a second embodiment of the invention is illustrated in FIG. 6.

This second embodiment proves to be advantageous in that, in addition to the writing and reading operations, the nano-sense amplifier nSA is also capable of ensuring refreshing/restoring operations. It is therefore not necessary to resort to a main sense amplifier MSA, which is notably expressed by a gain in surface area.

Further, the metal (Metal3), which is used as a main bitline MBL within the scope of the first embodiment, may under certain circumstances prove to be too wide relatively to the dimensions of the memory cell. The second embodiment allows this drawback to be overridden.

The nano-sense amplifier nSA of FIG. 6 includes a writing stage formed with a CMOS inverter formed with a P channel transistor T1, the source of which is connected to the potential V1 and an N channel transistor T2, the source of which is connected to the potential V2.

The input of the inverter is connected to a node N1, which node N1 is indirectly connected to the input terminal of the nano-sense amplifier (which is intended to be connected to a main bitline MBL).

The output of the inverter is connected to the output terminal of the nano-sense amplifier (which is intended to be connected to a local bitline LBL).

The nano-sense amplifier nSA of FIG. 6 further includes a reading stage comprising a transistor T3, the gate of which is connected to the output of the inverter (and therefore also to the local bitline LBL) and the drain of which is connected to the input of the inverter (node N1).

The reading stage comprises an additional transistor T4, complementary to the sense transistor, the additional transistor T4 and the sense transistor T3 forming a CMOS inverter, the input of which is connected to the output of the writing stage (and thus to the local bitline LBL) and the output of which is connected to the input of the inverter of the writing stage (and therefore to node N1). The transistors T4 and T3 are in series between power supply potentials V4 and V3. The writing T1, T2 and reading T3, T4 inverters are thus cross coupled, which will allow the nano-sense amplifier to perform the refreshing/restoring operations alone.

To finish, the nano-sense amplifier nSA of FIG. 6 comprises a decoding stage formed by a transistor T5 (N channel transistor in the illustrated example) the gate of which is controlled by a decoding signal YDEC, the source of which is connected to a main bitline MBL and the drain of which is connected to the node N1.

Within the scope of a preferred embodiment, the nano-sense amplifier nSA of FIG. 6 is made on a semiconductor-on-insulator substrate and each of the transistors T1-T5 has a back control gate Vbg1-Vbg5 capable of being biased in order to modify the threshold voltage of the corresponding transistor.

The different writing, reading and retention operations are described hereafter which may be implemented by the nano-sense amplifier of FIG. 6.

Retention

It is sought to avoid any static current, and to prepare the reading or writing operation which will follow by discharging the local bitline LBL to the low state GND.

The power supply potential V1 is in a low state, while the back control gate of the transistor T1 is in the high state. The threshold voltage of the transistor T1 is then increased. The power supply potential V1 is in a low state (typically 0 V), while the back control gate of the transistor T2 is in the high state. The threshold voltage of the transistor T2 is then lowered.

The power supply potential V3 is in the high state (VDD), while the back control gate of the transistor T3 is in the high state. The threshold voltage of the transistor T3 is then lowered. The power supply potential V4 is in the high state (VDD) while the back control gate of the transistor T4 is in the high state. The threshold voltage of the transistor T4 is then increased.

This allows the node N1 to be led to the high state, and to lead the local bitline LBL to the low state.

No decoding signal YDEC is applied to the gate of the transistor T5 (the decoder is not active during a retention operation), and the transistor T5 is blocked.

Reading (from the Retention)

The initial conditions are the following.

The local bitline LBL is in the low state.

The power supply potential V1 is in a low state, while the back control gate of the transistor T1 is in the high state. The threshold voltage of the transistor T1 is then increased, the transistor T1 then being blocked.

The power supply potential V2 is in the high state, while the back control gate of the transistor T2 is in the low state. The threshold voltage of the transistor T2 is then increased, the transistor T2 then being blocked.

The power supply potential V3 is in the low state (0 V), while the back control gate of the transistor T3 is in the high state. The threshold voltage of the transistor T3 is then lowered, while the transistor T3 is blocked. The power supply potential V4 is at VDD/2 or more, while the back control gate of the transistor T4 is in the low state. The threshold voltage of the transistor T4 is then reduced. The result is that the node N1 is led to VDD/2 or more.

The transistor T5 is, as for it, always blocked insofar that no decoder is yet active.

Reading continues in the following way following the opening of the word line which will select the cell.

In the case when the datum to be read is a "0", the local bitline LBL remains in the low state. In this case indeed, the local bitline LBL, as well as the cell, are in the low state (GND) so that when the transfer of charges from one to the other is allowed, nothing occurs since the balance already exists.

The power supply potential V1 is in the low state, while the back control gate of the transistor T1 is in the high state. The threshold voltage of the transistor T1 is then increased, the transistor T1 then being blocked. The power supply potential V2 is in the high state, while the back control gate of the transistor T2 is in the low state. The threshold voltage of the transistor T2 is then increased, the transistor T2 then being blocked.

The power supply potential V3 is in the low state (0 V), while the back control gate of the transistor T3 is in the high state. The threshold voltage of the transistor T3 is then lowered, while the transistor T3 is blocked since its gate connected to the local bitline LBL is at 0 V.

The power supply potential V4 is increased up to VDD, while the back control gate of the transistor T4 is in the low state. The threshold voltage of transistor T4 is then increased. The result is that the node N1 is led to VDD.

Next, V1 is increased, while the back control gate of the transistor T1 is brought to the low state. The threshold voltage of the transistor T1 is lowered; T1 being blocked insofar that its gate is connected to the node N1 which is at VDD. The transistor T2, the gate of which is also connected to the node N1 at VDD, as for it, is conducting. The local bitline LBL is then led to 0 V so that the datum may be refreshed.

The transistor T5 is, as for it, blocked insofar that no decoder is yet active. The transistor T5 is then made conducting when the potential of the node N1 is stable at VDD.

In the case where the datum to be read is a "1", the local bitline LBL is initially in the low state. In this case indeed, upon opening the word line, the balance is not attained.

Charges will then circulate between the cell and the local bitline LBL so as to equalize the voltages. The final voltage corresponds to a ratio between the capacitances of the local bitline LBL and of the cell (the longer the local bitline LBL, the weaker will be the signal). This voltage will be read by the nano-sense amplifier nSA.

The power supply potential V1 is in the low state, while the back control gate of the transistor T1 is in the high state. The threshold voltage of the transistor T1 is then increased, the transistor T1 then being blocked. The power supply potential V2 is in the high state, while the back control gate of the transistor T2 is in the low state. The threshold voltage of transistor T2 is then increased, the transistor T2 then being blocked.

The power supply potential V3 is in the low state (0 V), while the back control gate of the transistor T3 is in the high state. The threshold voltage of the transistor T3 is then lowered, while the transistor T3 is conducting since its gate, connected to the local bitline LBL, has a greater potential than the threshold voltage of T3.

The power supply potential V4 is increased up to VDD, while the back control gate of the transistor T4 is in the low state. The threshold voltage of the transistor T4 is then increased. The result is that the node N1 is led to 0 V.

Next, V1 is increased, while Vbg1 is brought to the low state. The threshold voltage of the transistor T1 is lowered; T1 being conducting insofar that its gate is connected to the node N1 which is at 0 V. The transistor T2, the gate of which is also connected to the node N1 at 0 V, is, as for it, blocked. The local bitline LBL is then led to VDD so that the datum may be refreshed.

The transistor T5 is, as for it, blocked insofar that no decoder is yet active. The transistor T5 is then made conducting when the potential of the node N1 is stable at 0 V. The signal present on the N1 node is then transferred onto the main bitline MBL.

"Write 0" Writing (from Initial Conditions)

The main bitline MBL is in the high state.

The transistor T5 is conducting, bringing the node N1 to the high state.

It will be noted that the transistor T5 may however have a substrate effect and not pass the whole of the signal on N1. This however is not very important insofar that the 4 transistors T1-T4 will amplify and restore the signal to "clean" logic levels.

V4 is brought from VDD/2 or more to the low state. The transistor T4 is then blocked.

V1 is brought from the low state to VDD, while Vbg1 is brought from the high state to the low state. The threshold voltage of T1 is low: T1 is blocked (N1 gate in the high state). Transistor T2 is conducting, while transistor T3 is blocked which allows the local bitline LBL to be brought to 0 V.

Next, V4 is brought from the low state to VDD. The information is now stable in the amplifier formed by the transistors T1-T4.

"Write 1" Writing (from Initial Conditions)

The main bitline MBL is in the low state.

The transistor T5 is conducting, leading the node N1 to the low state.

V4 is brought from VDD/2 or more to the low state. The transistor T4 is then blocked.

V1 is brought from the low state to VDD, while Vbg1 is brought to the low state. The threshold voltage of T1 is low: T1 is conducting which allows the local bitline LBL to be brought to VDD.

The transistor T2 is blocked, while the transistor T3 is conducting.

Next, V4 is brought from the low state to VDD. T4 is then blocked.

Various physical considerations are presented hereafter as regards the nano-sense amplifier of FIG. 6.

As shown earlier, the local bitline LBL is pre-charged to GND while the main bitline LBL is pre-charged to VDD (or to the same level as V4 during a reading operation).

The transistors T1 and T2 are as small as possible, their performances may be increased by virtue of their back control gate, and this both when they are conducting and when they are blocked.

The transistor T3 should drive the node N1 and then the main bitline MBL during a reading operation; T3 is as small as possible in order to minimize the charge of its front gate on the local bitline NBL and its performances may be increased by its back control gate for rapidly conducting N1 and MBL.

With the transistor T4, it is possible to secure the refreshing operations and to override the body effect of the transistor T5. It is selected to be as small as possible.

The transistor T5 should approximately have the same size as the transistor T3, if necessary with the same choices as regards the back control gate. The transistor T5 is not critical per se but requires about 8 to 128 buses in order to be able to operate as a decoder.

Eventually, the nano-sense amplifier of FIG. 6 is wider than that of FIG. 2, essentially because of the decoding bus YDEC. This bus may however be shared between two adjacent matrices if these matrices store different data bits.

The nano-sense amplifier of FIG. 6 however does not require any main sense amplifier, by which the increase in size may be compensated, as far as the YDEC bus has a reasonable size.

With it, it is further possible to override the limitations due to possible congestion of the Metal3 in the case of the first embodiment, insofar that the main bitline is decoded.

It has to be noted that that the nano-sense amplifier according to the first embodiment presented on FIG. 2 is based on a "half latch" structure, while the nano-sense amplifier according to the second embodiment presented on FIG. 6 is constructed on the "full latch" structure. The proposed schematics are the preferred schematics but it is clear that these structures can be built on other schematics comprising more transistors either in the latching part or in the decoder or precharged parts.

The performance of the nano-sense amplifiers (both embodiments) is obtained through the use of a back gate on SeOI. However, it is clear that the principle can be also applied on any type of double-gate transistors having a second gate such as the multi-gate finFets for instance.

It has furthermore to be noted that the simplification of the schematics, through the reduction in number of devices and in their reduced sizes, makes the application of the nano-sense amplifier according to the invention very attractive to other (e.g. matrix array like) circuits than memories such as imagers or analogue converters for instance. In another application, the nano-sense amplifier can be used as a bus regenerator.

Figure 7:
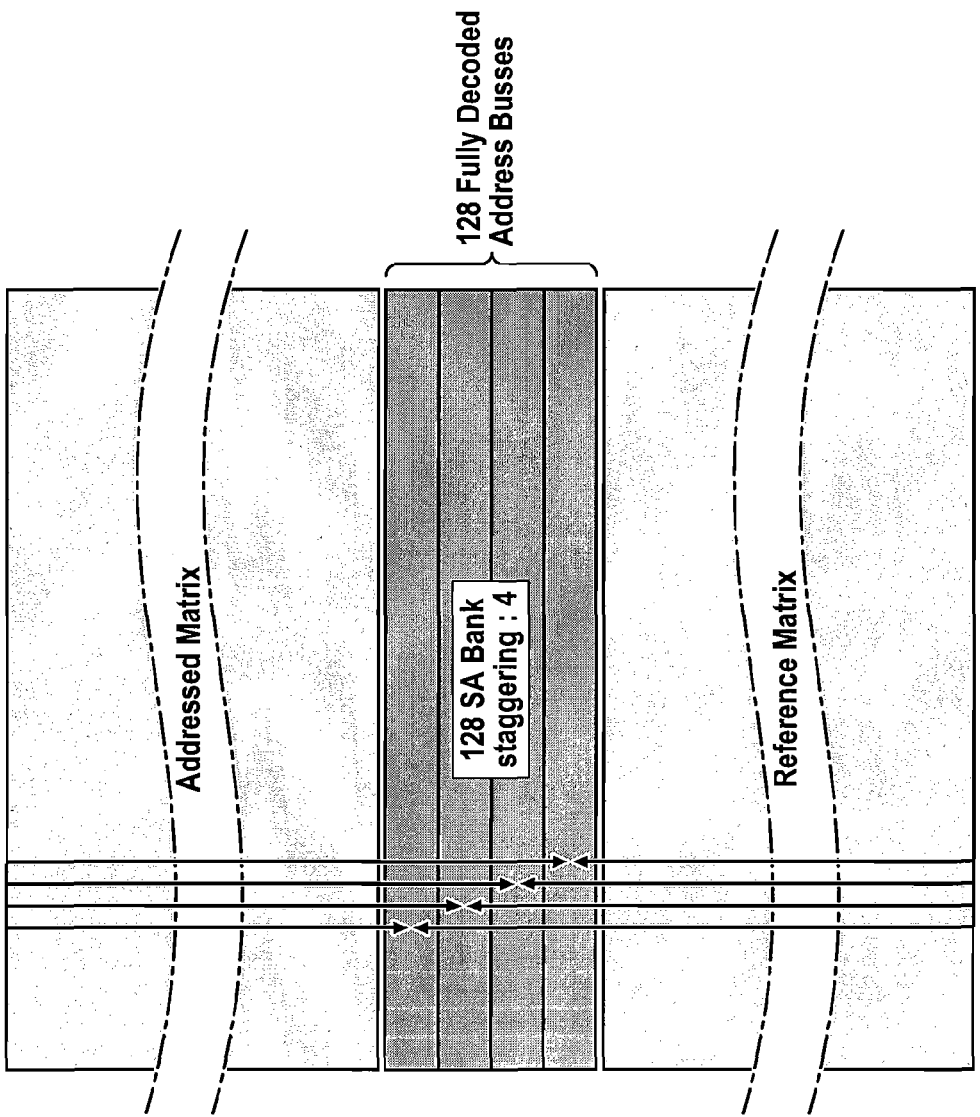
FIG. 7 illustrates the state-of-the-art array architecture.

As indicated earlier, the nano-sense amplifier provides its own reference (threshold voltage of transistor T3) and therefore it does not need the presence of a second matrix to serve as a reference like on a conventional architecture represented on FIG. 7 (indeed, conventional systems need a reference Matrix for compensation of unknown offset values that are due to irregularities in the fabrication process).

In addition, as it will discussed in further details below, since the nano-sense amplifier is very compact, it can be arranged in a periodicity meeting the minimum pitch of memory arrays that can be attained with state of the art lithographic techniques. The additional area between adjacent memory arrays can further be used for other circuits, on-pitch or non-pitched circuits.

The nano-sense amplifier having a reduced width, there is no need resorting to a stacking technique, a so-called "staggering" technique, for several conventional sense amplifier circuits behind each other in order to address several adjacent columns of memory cells while taking into account the pitch difference in between the sense amplifier and the cells).

Figure 8A:
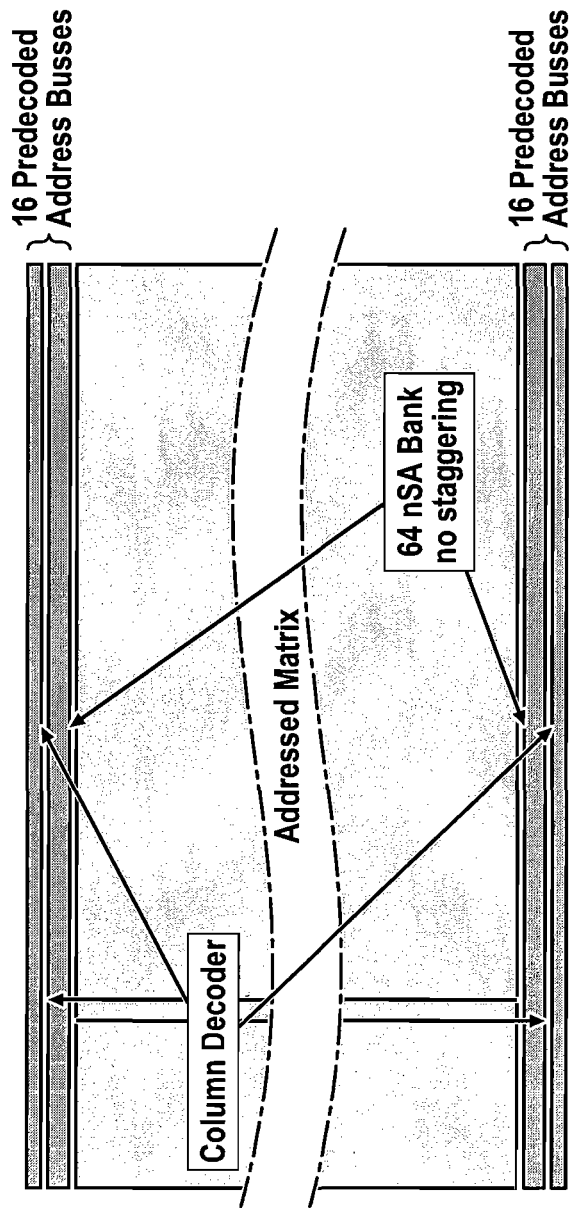
FIG. 8a illustrates an innovative array architecture using two banks of nano-sense amplifiers according to the invention.

As shown on the example of FIG. 8a, rather than making use of a single bank of 128 staggered conventional sense amplifiers (FIG. 7), it is possible to make use of two banks of nano-sense amplifiers (here the nano-sense amplifiers are said to be effectively "on-pitch" in that they may be as large as 2 times the pitch of the cells; it may also be possible to provide perfectly "on-pitch" nano-sense amplifiers, as large as the cells).

Figure 8B:
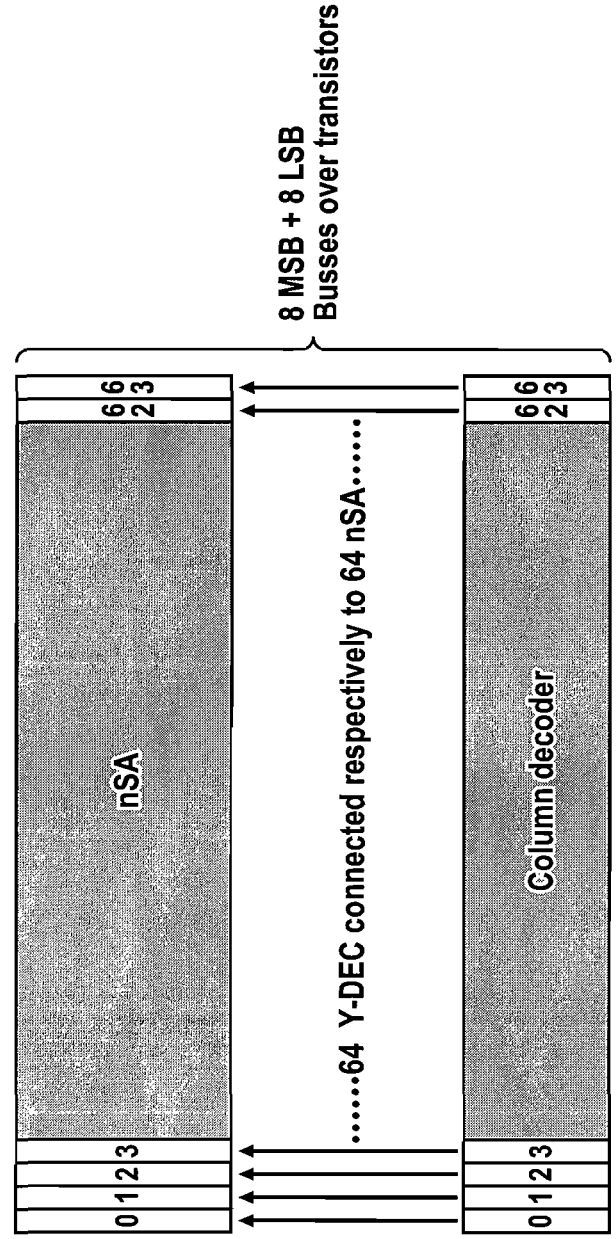

It further becomes possible to locally decode these nano-sense amplifiers by placing the logic of the column decoder on the "free" edge of a bank of nano-sense amplifiers bank as it is represented on FIG. 8a and FIG. 8b. For instance, if the architecture of the conventional circuit initially required 128 busses to decode each sense amplifier within the bank like on FIG. 7, then the new organization of the nano-sense amplifier and its decoder requires only 16 busses (8 most significant bits—MSB—and 8 least significant bits—LSB) to fulfil the same functionality.

This feature is particularly advantageous as the nano-sense amplifier occupies significantly less area than the conventional sense amplifier and therefore needs only few metal busses over its area to decode the bank. Most of the column decoder circuit can be integrated into the on-pitch area and no longer need to be in the periphery of the memory, i.e. becomes an on-pitch circuit and thus becomes itself very small in area and has a much lower power consumption and a higher speed.

Figure 9A:
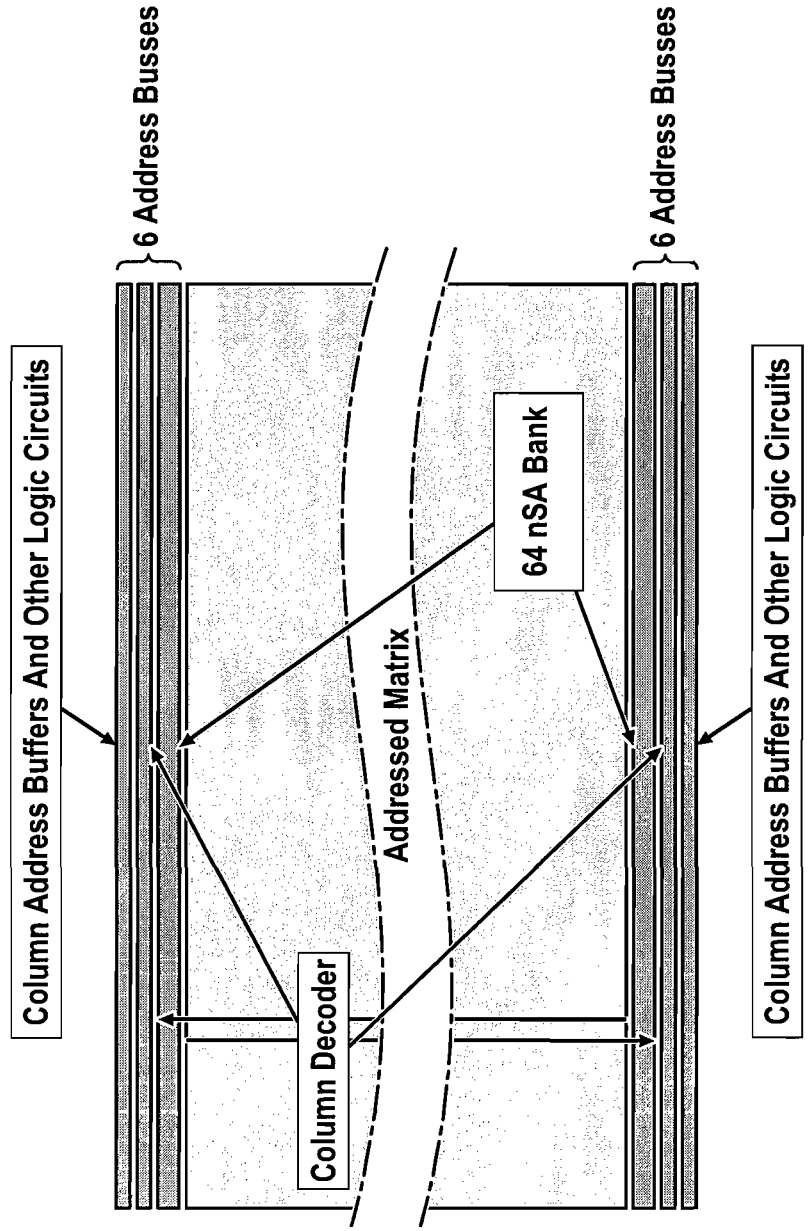
FIG. 9a illustrates an extended innovative array architecture using two banks of nano-sense amplifiers according to the invention.
Figure 9B:
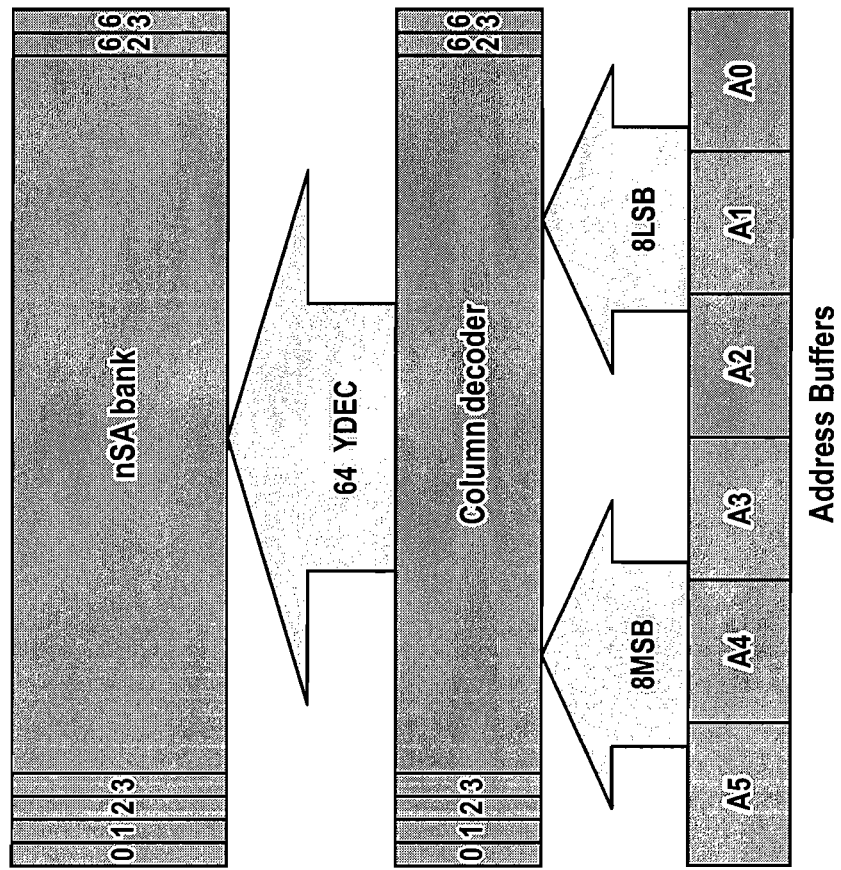

The integration of other circuit blocks into the on-pitch area, next to nano-sense amplifier banks can be extended for instance to the address buffers themselves as shown on FIGS. 9a and 9b. The address buffers can be distributed under the column decoder and the requirement for busses decreases to two groups of 3 addresses in the given example. This second row of function may be not "on pitch" as the number of circuits does not correspond to the array pitch.

Other functionalities can also be placed in a similar manner next to the nano-sense amplifiers banks, such as, for example voltage generators, pumps, analog functions, or redundancy control. There is virtually no constraint and the absence of bitline reference in the nano-sense amplifier provides flexibility to optimize all the peripheral functions of the circuit.

It has been shown that placing the column decoder next to the nano-sense amplifier bank decreases the amount of busses needed by a factor 4. Furthermore, the remaining busses are shorter as they are integrated in the on-pitch area. The immediate consequence of a local decoding approach is a gain in area as the number of bus drivers (buffers) may be reduced thanks to the proximity, and they are smaller as well as less loaded. The power consumption is also reduced for the same reasons. Speed can be increased at no extra cost because of less parasitics.

Placing other circuits can be also beneficiary for the circuit. For instance, having this opportunity to place the different voltage generators next to their load (Vplate, VBLH, etc. . . ) reduces or cancels most of the sources of disturbances (ohmic losses, capacitive couplings) for these functions.

It is clear that the organization shown in FIGS. 8a-8b and 9a-9b are examples, and the person skilled in the art would contemplate that other block organizations are possible. In particular the sense amplifiers could be organized on only one side of the array, or two blocks can be disposed on either side of the array to address the odd and even bitlines, respectively.

What is claimed is:

1. A sense amplifier (nSA) of a series of cells (Ci, Cj) of a memory, including:
   a writing stage comprising a CMOS inverter (T1-T2), the input of which is directly or indirectly connected to an input terminal of the sense amplifier, and the output of which is connected to an output terminal of the sense amplifier intended to be connected to a local bitline (LBL) addressing the cells of said series, and
   a reading stage comprising a sense transistor (T3), the gate of which is connected to the output of the inverter and the drain of which is connected to the input of the inverter,
   wherein one or more of the transistors are multigate transistors.

2. The sense amplifier according to claim 1, wherein at least one multigate transistor is a FinFET.

3. The sense amplifier according to claim 1, wherein the input of the writing stage is directly connected to the input terminal of the inverter, said input terminal being intended to be connected to a main bitline (MBL) which will address a plurality of sense amplifiers in parallel.

4. The sense amplifier according to claim 1, wherein the reading stage comprises an additional transistor (T4) complementary to the sense transistor, the additional transistor and the sense transistor forming a CMOS inverter, the input of which is connected to the output of the reading stage and the output of which is connected to the input of the inverter of the writing stage.

5. The sense amplifier according to claim 4, wherein the input of the writing stage is indirectly connected to the input terminal of the inverter via a decoding stage comprising a transistor (T5), the drain of which is connected to the input terminal of the sense amplifier and the source of which is connected to the input of the writing stage.

6. The sense amplifier according to claim 1, which is made on a semiconductor-on-insulator substrate comprising a thin layer of semiconducting material separated from a base substrate by an insulating layer, and wherein each of the transistors has a back control gate formed in the base substrate below the channel and capable of being biased in order to modulate the threshold voltage of the transistor.

7. A method for controlling a sense amplifier according to claim 1, which comprises modifying the biasing of one of the gates of the transistors during operations for writing, reading or retaining of data in the cells of the series.

8. A method for controlling a sense amplifier according to claim 7, which comprises modifying the biasing of the back control gates during operations for writing, reading and retaining data in the cells of the series.

9. The method according to claim 8, wherein the biasing of the back control gates is controlled during a reading operation to increase the threshold voltage of the transistors of the writing stage and to reduce the threshold voltage of the transistor(s) of the reading stage.

10. The method according to claim 8, wherein the biasing of the back control gates is controlled during a writing operation to reduce the threshold voltage of the transistors of the writing stage and to increase the threshold voltage of the transistor(s) of the reading stage.

11. The method according to claim 8, wherein during a retention operation, the local bitline is discharged via one of the transistors of the writing stage, for which the biasing of the back control gate is controlled so as to lower its threshold voltage.

12. A main sense amplifier (MSA) intended to be connected via a main bitline (MBL) to a plurality of sense amplifiers according to claim 1, comprising a step for amplifying the signal (T6-T10) delivered by a cell during a reading operation, and a switchable high impedance inverter stage (HZ1) for sending back the amplified signal onto the main bitline following the reading operation.

13. A sense amplifier (nSA) including:
a writing stage comprising a CMOS inverter (T1-T2), the input of which is directly or indirectly connected to an input terminal of the sense amplifier, and the output of which is connected to an output terminal of the sense amplifier intended to be connected to a local line, and
a reading stage comprising a sense transistor (T3), the gate of which is connected to the output of the inverter and the drain of which is connected to the input of the inverter;
wherein one or more transistors of the writing stage and of the reading stage are independent double gate transistors.

14. A matrix array of cells connected to local bitlines and to wordlines, comprising a sense amplifier according to claim 1.

15. A matrix array of cells according to claim 14, wherein the sense amplifiers are made on a semiconductor-on-insulator substrate.

16. A matrix array of cells according to claim 15, wherein the sense amplifiers are arranged in one or more sense amplifier banks and further comprising a column decoder placed next to each bank and configured to drive said bank directly.

17. A matrix array of cells according to claim 16, further comprising logic circuits placed next to the sense amplifier banks or the column decoder.

18. A memory including a matrix array of cells according to claim 14.

19. A matrix array of cells comprising sense amplifiers and column decoders, wherein the sense amplifiers are arranged in a non-staggered fashion in one or more sense amplifier banks and wherein a column decoder is placed next to each bank and configured to drive said bank directly.

20. A method for controlling a sense amplifier according to claim 1, which comprises modifying the biasing of one of the gates of the transistors during operations for writing, reading or retaining of data in the cells of the series.

* * * * *